United States Patent [19]

Luther et al.

[11] 4,273,321
[45] Jun. 16, 1981

[54] APPARATUS FOR FEEDING CONDUCTOR PLATES INTO A CONDUCTOR PLATE TESTER

[75] Inventors: Erich Luther, Ronnenberg; Martin Maelzer, Wunstorf, both of Fed. Rep. of Germany

[73] Assignees: Luther & Maelzer GmbH, Wunstorf, Fed. Rep. of Germany; Limited-Liability Company, both of Fed. Rep. of Germany

[21] Appl. No.: 970,484

[22] Filed: Dec. 18, 1978

[30] Foreign Application Priority Data

Apr. 6, 1978 [DE] Fed. Rep. of Germany ....... 2814954

[51] Int. Cl.³ .......................... B65H 3/24; B65H 3/46
[52] U.S. Cl. ......................................... 271/10; 271/1; 271/131; 271/136; 271/138; 271/144; 414/131
[58] Field of Search ................ 271/10, 131, 136, 137, 271/138, 139, 140, 141, 142, 143, 144, 132, 133, 134, 135, 1; 221/285, 194, 195, 268; 414/131

[56] References Cited

U.S. PATENT DOCUMENTS

| 182,104 | 9/1876 | Clark | 271/144 |
|---|---|---|---|
| 847,625 | 3/1907 | Velk | 271/142 |
| 1,159,623 | 11/1915 | Tomlinson | 271/138 |
| 1,625,157 | 4/1927 | Roberts | 271/138 |
| 1,915,921 | 6/1933 | Carle | 271/144 |
| 3,312,473 | 4/1967 | Friedman et al. | 271/136 X |
| 3,870,294 | 3/1975 | Donner | 271/165 X |

Primary Examiner—Bruce H. Stoner, Jr.
Attorney, Agent, or Firm—Owen, Wickersham & Erickson

[57] ABSTRACT

Conductor plates are fed to a conductor plate tester from a stack by a reciprocating feeder which removes the lowermost plate only of the stack and propels it forwardly to a transport path. The transport path is inclined downwardly toward said tester, the feeder is also inclined at the same angle, with the stack perpendicular thereto. As a result, the conductor plates are moved along the transport path by the force of gravity.

4 Claims, 7 Drawing Figures

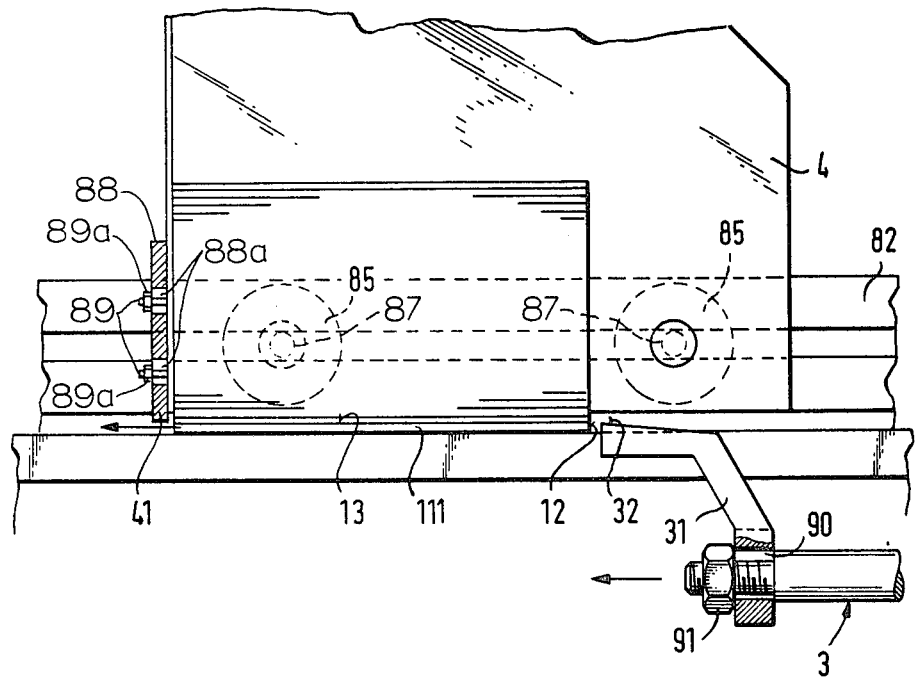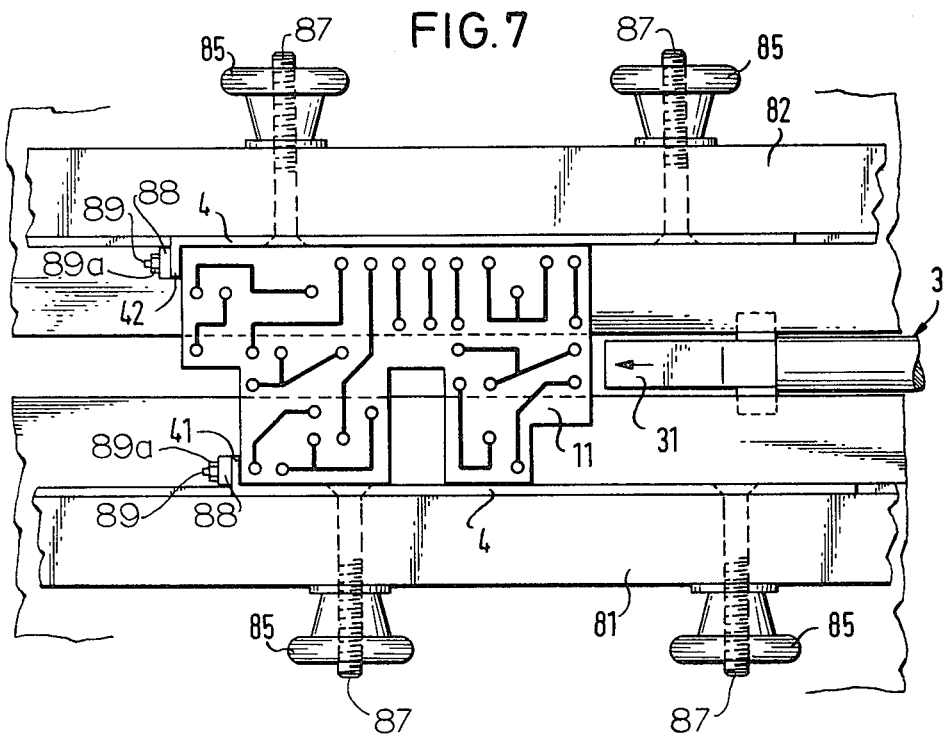

APPARATUS FOR FEEDING CONDUCTOR PLATES INTO A CONDUCTOR PLATE TESTER

BACKGROUND OF THE INVENTION

The invention relates to a method and apparatus for feeding conductor plates into a conductor plate tester.

In producing printed circuits, the electronics industry uses conductor plates into which individual component parts are soldered, so that a finished circuit is obtained. Prior to complementing the conductor plates with component parts, the conductor plates must be examined as to their capability to function. This is done with conductor plate testers which test the conductor plate as to interrupter defects in the individual lines and as to an offset between contact eyes and contact holes, as well as for faulty insulation. For this purpose, the conductor plates are introduced successively from a stockpile into the actual tester.

In the case of the hitherto-known conductor plate testers, the individual conductor plates are transported on a horizontal conveying path from the feeder over the test section up to the sorting device in which the conductor plates are sorted out as to defects. The individual conductor plates may be moved out of the stockpile, for example, by a slide. For structural reasons, the slide is as a rule not capable of moving the conductor plates over long distances, for example, all the way from the feeder to the test section; therefore, it is necessary with the known instruments to move at least two adjacent conductor plates at once, the slide engaging the rear plate which, in turn engages the forward plate, each cycle thereby moving the forward plate into the next test position. This structure requires a relatively expensive transport mechanism, as well as an expensive positioning mechanism. Further, this type of feeder device is relatively long, since at least two of the longest conductor plates which are to be tested must be moved one ahead of the other.

An important object of the invention is to provide a simpler apparatus and method by which the conductor plates can be moved over the transport path one at a time into the individual testing stations.

SUMMARY OF THE INVENTION

The invention calls for retaining a stack of thin plates, preferably on a base plate and for reciprocating feeding means to remove the lowermost plate only from the stack and to propel it forwardly to a transport path that leads it to the tester. The invention is characterized by the transport path being inclined downwardly toward the tester, so that the conductor plates are moved therealong by the force of gravity and also by the feeding means being inclined at the same angle, with the stack-retaining means perpendicular thereto. The inclination of the transport path preferably lies between about 10° and about 30°.

Preferably, the angle of inclination is made adjustable, as by incorporating the stack, the feeding means, the base plate and at least part of the transport path into a frame which is rotatably mounted on a horizontal guide rod lying above and transverse to the transport path. This enables varying the inclination angle as may be desired; then the frame is locked at a selected rotary position.

The feeding means may comprise a slide movable in the direction of the transport path, preferably with an end member moving in a slot in the base plate. The end member engages the upper edge of the lowermost conductor plate, for movement of that plate out from under the stack. Preferably, the end member is adjustable in height, preferably so that the upper edge of the end member is disposed in the same plane as or slightly below the upper surface of the lowermost conductor plate resting on the base plate. Also, preferably, the direction of movement of the slide extends through the center of gravity of the conductor plate which is to be moved.

A preferred construction includes control means for holding the last conductor plate of the stockpile in control along the plane of the path while that last plate is being moved thereto. For example, the base plate has at least one recess, preferably two recesses, in each of which a spring is located so that when it is in an untensioned condition, it projects above the top of the base plate. Each recess may be in the form of a groove and the spring may be a plate spring. Preferably, the plate spring is so curved, dimensioned, and tensioned, that when it supports only a single plate, it raises that single conductor plate above the upper edge of the end of the slide, while when it supports two or more conductor plates, the spring is depressed within the groove.

The apparatus may also include stops for the conductor plates, mounted above the base plate and adjustable back in the direction of the feed and in the direction vertical thereto. These stops may be mounted on side walls which are adjustably secured to an adjusting bar, each adjusting bar being swingably mounted on a guide rod.

Thus, in its method aspects, the invention includes positively moving the lowermost plate downwardly along an inclined path and then continuing movement thereof along the same inclination downwardly by virtue of the force of gravity. It also includes holding the lowermost conductor plate on the base plate by means of friction by the weight of the conductor plates loaded above it until the positive moving step takes place.

The invention will be described and explained in further detail hereinbelow in connection with an embodiment and the drawings.

BRIEF DESCRIPTION OF THE DRAWINGS

In the drawings:

FIG. 6 is a view in side elevation taken along the line 6—6 in FIG. 4 and showing how the last conductor plate of a stack is moved out of a stockpile.

FIG. 7 is a top plan view of an apparatus in accordance with the invention, showing a conductor plate thereon.

The method and apparatus of the invention are described together hereinbelow.

DESCRIPTION OF A PREFERRED EMBODIMENT

Figure 1:
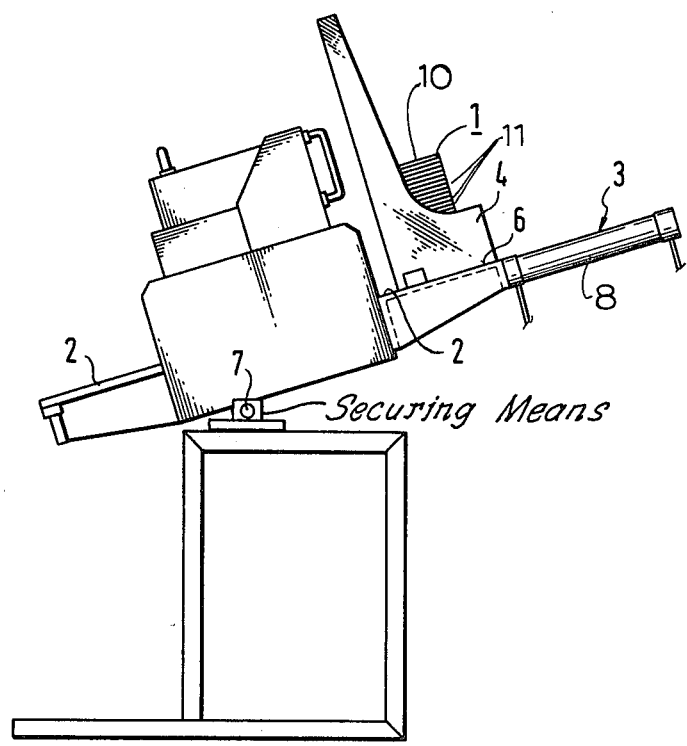
FIG. 1 is a schematic side view of an apparatus embodying the principles of the invention, suitable for use in the method of the invention.

FIG. 1 is a schematic side view of an apparatus for feeding conductor plates 11 into a tester. A stockpile 1 of conductor plates 11 is held by side walls 4 provided with stops 41,42, shown in FIGS. 3, 4, and 6. A downwardly inclined transport path 2 enables conductor plates 11 which are pushed by means of a slide assembly 3 from a base plate 6 onto the transport path 2 to be transported forward (to the left in FIG. 1) from there by virtue of the force of gravity. Since, because of their weight, the conductor plates 11 move downwardly, there is no need for a special transport device which would move the conductor plates 11 forward on the paths 2. This also makes it possible to introduce each conductor plate 11 individually into the test device without its being necessary, as was the case heretofore, to push the juxtaposed conductor plates by means of the slide 3. The device is pivotable about an axis of rotation 7 by which the angle of inclination of the path 2 may be adjusted as desired; securing means enables locking the device to the main support means at any desired inclination angle; it is typically between 10° and 30° to the horizontal.

Figure 2:
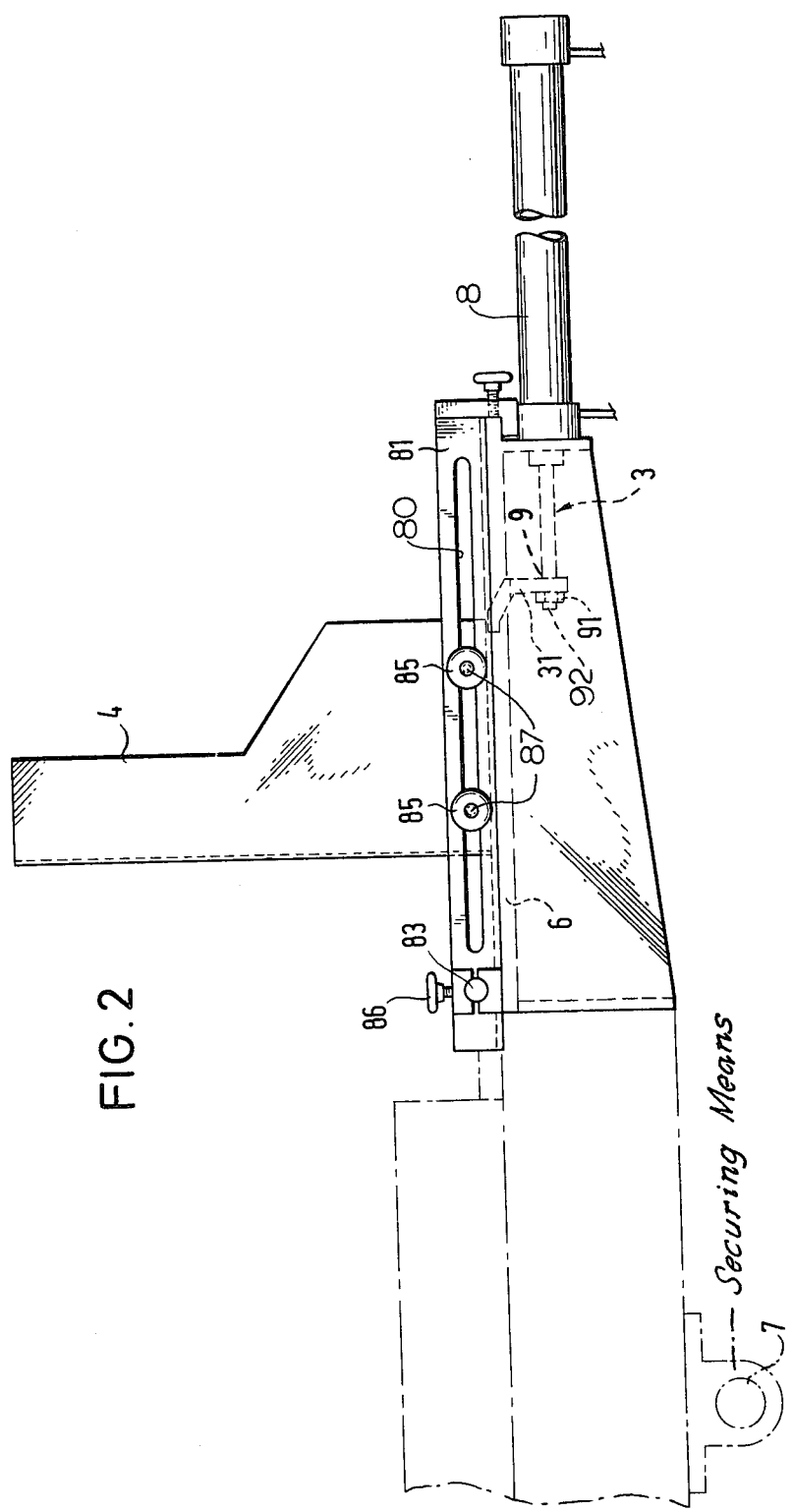
FIG. 2 is an enlarged view in side elevation of a portion of an apparatus generally like that of FIG. 1, but modified somewhat in shape.

FIG. 2 shows a detail of a portion of FIG. 1. At the forward end of the slide 3 which may be actuated pneumatically, by a pneumatic cylinder 8 and portion 9, for example, is a forward end member which is preferably adjustable as to height and engages the lowermost conductor plate 111 (compare FIG. 6) and pushes it from the base plate 6 onto the path 2. In FIG. 2, it may be seen that the side walls 4 are made movable in the direction of transport. For this purpose, as shown also in FIGS. 3 and 4, they may be secured to adjusting slots 80 in a pair of bars 81,82 by means of knurled fastening nuts 85 on threaded bolts 87, which are horizontally movable in the slots 80. The nuts 85 can be loosened, so that the side walls 4 may be displaced horizontally along the slots 80 in the bars 81 and 82. The adjusting bars 81 and 82 are in turn themselves displaceable. For this purpose, they are secured to at least one guide rod 83 which is mounted horizontally above and transversely to the direction of transport of the conductor plates 11. When an associated screw 86 is loosened, the corresponding displacing bar 81 or 82 may be laterally adjusted along the guide rod 83, as by pins 93 on a member 94. Thumb screws 95 aid in holding the bars 81 and 82 to an end flange 84.

Figure 3:
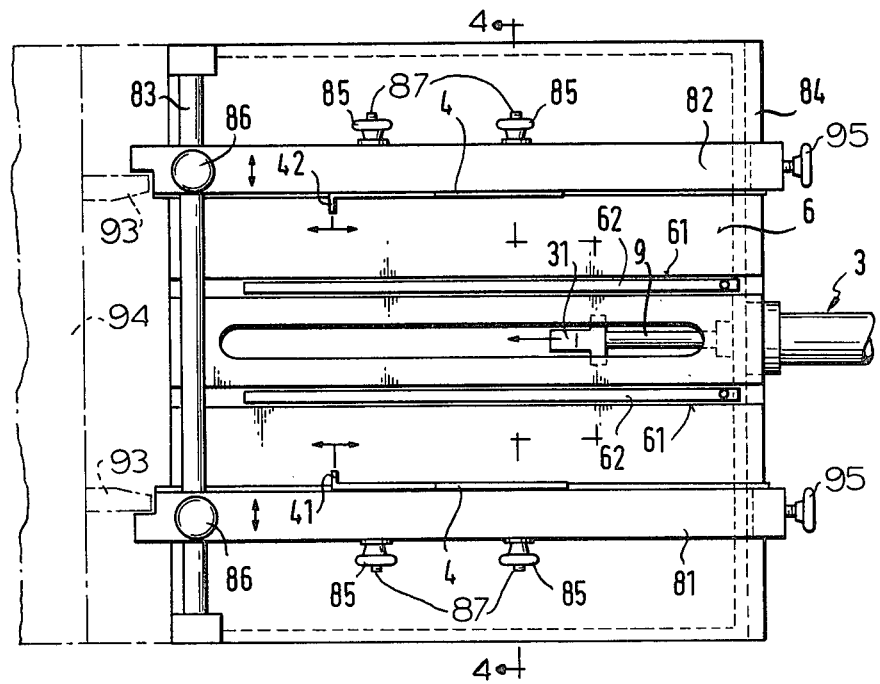
FIG. 3 is a top plan view of a feeder device embodying the principles of the invention.

FIGS. 3 and 7 show that the stops 41 and 42 are also adjustable individually, along with the side walls 4, so that they may be adapted to any desired shape of conductor plates 11. This adjustability of the stops 41 and 42 makes it possible to locate the position of the conductor plates 11 in relation to the slide 3 in such a manner that, when a plate 11 is pushed off from the stack 1, the slide 3 impinges at all times on an edge 12 (See FIG. 6) disposed vertically to the direction of the shift. This prevents the slide 3 from imparting a lateral movement to the conductor plate 11 or rotating it when pushing it off, which could happen, for example, if the slide 3 would impinge obliquely. Further, it is possible with the aid of the movable stops 41 and 42 to position the stack or stockpile 1 of conductor plates 11 so that the slide 3 cannot engage a recess in the conductor plates 11 and thereby cause the slide 3 to be wedged into the conductor plate 11. Further, the individual adjustability of the stops 41 and 42 makes it possible to align the conductor plates 11, in relation to the slide 3 so that the direction of movement passes through the center of gravity of the conductor plate 11, which, as shown in FIG. 7, may have an asymmetric shape so that the center of gravity is often not midway between the two longitudinally extending edges. This also prevents canting of the conductor plates 11 when they are pushed off. The end member 31 of the slide 3, the side walls 4, and the stops 41,42 are also adjustable as to their height, as described below, so that they can be adapted to varying thicknesses of the conductor plates which are to be tested. The height-adjustable part 31 of the slide 3 is adjusted so that its upper edge 32 (FIG. 5) lies either in the same plane as the upper surface 13 of the conductor plate 11 or slightly lower (compare FIG. 6). This insures safe engagement of the slide 3 and faultless delivery of the individual conductor plates 11 from the stockpile 1.

Figure 4:
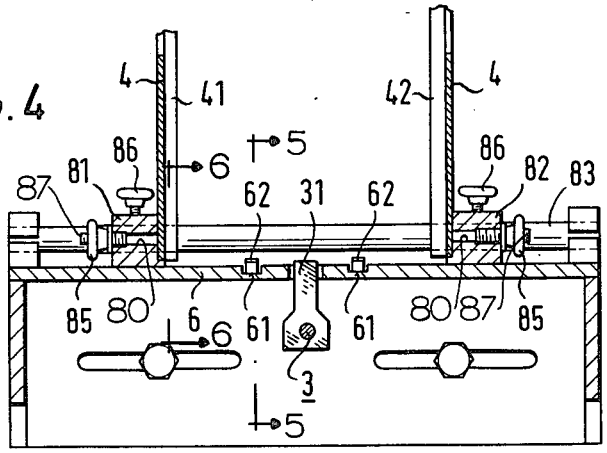
FIG. 4 is a view in section through the feeder device taken along the line 4—4 in FIG. 3.
Figure 5:
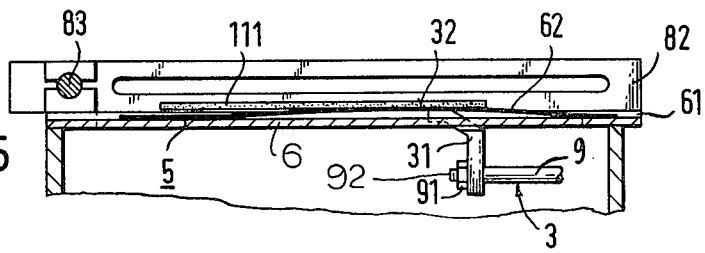
FIG. 5 is a view in section taken along the line 5—5 in FIG. 4, omitting certain elements for clarity, and showing a control device for controlling the last conductor plate of a stack.

The weight of the superposed conductor plates of the stockpile 1, holds the lowermost conductor plate 111 frictionally on the base plate 6, so that it does not reach the transport path 2 uncontrolled, but only when the slide 3 is actuated. This friction retention does not obtain, however, in the case of the last or uppermost conductor plate 10. This last plate 10 could slide uncontrolled onto the paths 2. In order to prevent this, it is raised by a control device 5 (see FIG. 5), so that it is held accurately by the stops 41,42. The device 5 raises the last plate 10 until its lower surface is higher than the upper edge 32 of the end member 31 secured to the slide 3, so that, when the slide 3 is actuated, the end member 31 does not come against the edge of the last plate 10 of the pile 1 (compare FIG. 5). The construction of this control device 5 is illustrated in FIGS. 3 to 5. The base plate 6 is provided with grooves 61 in which plate springs 62 are disposed. The springs 62 are so dimensioned that, as a function of the weight of the pile 1 of plates 11 resting on them, they urge the last plates upwardly, when the height of the pile 1 becomes less than a specified number of plates and thereby below a specified weight. As a practical matter, the springs 62 are preferably dimensioned so that they raise only the last plate 10 and thereby prevent its further slippage.

FIG. 6 makes it clear that the stops 41,42 which are secured to the side walls 4, are displaceable as to height. For this purpose plates 88 with vertical slots 88a are used in combination with the stops 41,42 and bolts 89 with nuts 89a. This height displacement is adjusted so that only one conductor plate 11 at a time can pass through the gap formed between these stops 41 and 42 and the base plate 6. The result is that, when the lowermost conductor plate 111 is moved, it is the only plate 11 to reach the transport path 2, and the conductor plate disposed above it is not entrained because of friction. Also in FIG. 6, the height displacement of the end member 31 on the slide 3 is illustrated. For this purpose, the end member 31 is provided with a vertically elongated slot 90 through which a threaded bolt-like end 92 of the slide 3 projects. By relaxing a lock nut 91, the height of the part 31 can then be adjusted according to the thickness of the conductor plates 11.

In FIG. 7, it is shown that the stops 41, 42 can be displaced as desired, so that they can be adapted to any shape of conductor plates.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. Apparatus for feeding conductor plates from a stack thereof to a conductor plate tester, including in combination:
    a base plate supporting a stack of thin conductor plates,
    stack forming means for retaining said stack,
    reciprocating feeding means for removing the lowermost plate only of said stack from said stack and propelling it forwardly,
    a transport path disposed in the same plane as said base plate, for receiving each forwardly projected plate and leading it to said tester,
    said transport path being inclined downwardly toward said tester, so that said conductor plates are moved therealong by the force of gravity,
    said feeding means being inclined at the same angle as said transport path and said stack-forming means being perpendicular thereto, and
    control means for preventing the last, uppermost, conductor plate of the stack from sliding down the transport path uncontrolled after the remaining plates of the stack have been removed, said control means including said base plate having at least one recess and a spring located in said recess which, when in untensioned condition, projects above the upper surface of the base plate.

2. Apparatus in accordance with claim 1 wherein each said recess is in the form of a groove and each spring is a plate spring disposed in said groove.

3. Apparatus in accordance with claim 2 wherein said plate spring is so curved, dimensioned, and tensioned that when it supports only a single said plate, it raises that single conductor plate above the upper edge of the end member of the slide, and that, when it supports two or more conductor plates, said plate spring is depressed within its groove.

4. Apparatus for feeding conductor plates to a conductor plate tester, including in combination:
    stack forming means for retaining a stack of thin conductor plates,
    reciprocating feeding means for removing the lowermost plate only of said stack from said stack and propelling it forwardly,
    a transport path for receiving each forwardly projected plate and leading it to said tester,
    a base plate supporting said stack of conductor plates and disposed in the same plane as said transport path,
    said transport path being inclined downwardly toward said tester, so that said conductor plates are moved therealong by the force of gravity,
    said feeding means being inclined at the same angle as said transport path and said stack-forming means being perpendicular thereto,
    main support means for said apparatus having a cylindrical horizontal rod transverse to said transport path,
    frame means carrying said stack-forming means and said feeding means and at least a portion of said transport path, said frame means being rotatably mounted on said horizontal rod so that said inclination angle can be varied,
    securing means for locking said frame means to said main support means at any desired inclination angle,
    a guide rod secured to said frame and extending transversely thereacross,
    stops for said conductor plates mounted above the base plate, said stops being adjustable in position both in the direction of the feed and in the direction vertical thereto,
    a pair of side walls to each of which a said stop is mounted, and
    a pair of adjusting bars to each of which a said side wall is adjustedly secured, each adjusting bar being slidably mounted on said guide rod.

* * * * *

UNITED STATES PATENT AND TRADEMARK OFFICE
CERTIFICATE OF CORRECTION

PATENT NO. : 4,273,321
DATED : June 16, 1981
INVENTOR(S) : Erich Luther and Martin Maelzer It is certified that error appears in the above-identified patent and that said Letters Patent are hereby corrected as shown below:

First page, left-hand column, item [73] should read:

--[73] Assignees: Luther & Maelzer GmbH, a limited-liability company, Wunstorf, Fed. Rep.

of Germany--.

Signed and Sealed this

Twenty-third Day of February 1982

[SEAL]

Attest:

GERALD J. MOSSINGHOFF

Attesting Officer

Commissioner of Patents and Trademarks